(12) United States Patent
Nakayama et al.

(10) Patent No.: US 8,365,919 B2
(45) Date of Patent: Feb. 5, 2013

(54) SUBSTRATE STORAGE CONTAINER

(75) Inventors: Takayuki Nakayama, Itoigawa (JP); Atsushi Sumi, Sendai (JP)

(73) Assignee: Shin-Etsu Polymer Co., Ltd., Chuo-Ku, Tokyo (JP)

( * ) Notice: Subject to any disclaimer, the term of this patent is extended or adjusted under 35 U.S.C. 154(b) by 518 days.

(21) Appl. No.: 11/319,443

(22) Filed: Dec. 29, 2005

(65) Prior Publication Data

US 2007/0151897 A1    Jul. 5, 2007

(51) Int. Cl.
    *B65D 85/00* (2006.01)
(52) U.S. Cl. ........ 206/711; 206/712; 206/722; 206/723; 206/725
(58) Field of Classification Search .......... 206/710, 206/711, 722, 723, 725, 454, 712; 118/500
    See application file for complete search history.

(56) References Cited

U.S. PATENT DOCUMENTS

| | | | | |
|---|---|---|---|---|
| 4,072,230 | A * | 2/1978 | Mulligan ............... | 206/722 |
| 5,788,082 | A * | 8/1998 | Nyseth ................... | 206/711 |
| 6,223,886 | B1 | 5/2001 | Bonora et al. | |
| 6,267,245 | B1 * | 7/2001 | Bores et al. .......... | 206/711 |
| 6,273,261 | B1 * | 8/2001 | Hosoi ................... | 206/711 |
| 6,382,419 | B1 | 5/2002 | Fujimori et al. | |
| 6,446,806 | B1 * | 9/2002 | Ohori et al. .......... | 206/454 |
| 6,499,602 | B2 * | 12/2002 | Yajima et al. ......... | 206/711 |
| 6,520,338 | B2 * | 2/2003 | Bores et al. .......... | 206/711 |
| 6,533,101 | B2 | 3/2003 | Bonora et al. | |
| 7,051,887 | B2 * | 5/2006 | Huang et al. ......... | 211/183 |
| 7,168,153 | B2 * | 1/2007 | Buitron et al. ........ | 29/603.04 |
| 7,201,276 | B2 * | 4/2007 | Burns et al. ......... | 206/710 |
| 7,322,098 | B2 * | 1/2008 | Buitron et al. ....... | 29/604 |
| 7,357,258 | B2 * | 4/2008 | Matsutori et al. ..... | 206/711 |
| 2001/0045174 | A1 * | 11/2001 | Horn .................... | 104/134 |
| 2004/0099569 | A1 | 5/2004 | Matsutori et al. | |

FOREIGN PATENT DOCUMENTS

| | | |
|---|---|---|
| JP | SHO60-190625 U | 12/1985 |
| JP | HEI5-59223 U | 8/1993 |
| JP | 10-70185 A | 3/1998 |
| JP | 2000-306988 A | 11/2000 |
| JP | 2002-009142 A | 1/2002 |

* cited by examiner

*Primary Examiner* — J. Gregory Pickett
*Assistant Examiner* — Raven Collins
(74) *Attorney, Agent, or Firm* — Buchanan Ingersoll & Rooney PC

(57) ABSTRACT

A substrate storage container includes: a container body of a front open box type for holding a multiple number of semiconductor wafers supported in alignment by supporting ribs; a bottom plate removably attached to the bottom of the container body; and a pair of conveyor contact rails integrally formed along both the left and right sides of this bottom plate. These conveyor contact rails inhibit vibrations and impacts acting on the semiconductor wafers when the sealed container body is conveyed by a conveyor.

12 Claims, 8 Drawing Sheets

SUBSTRATE STORAGE CONTAINER

BACKGROUND OF THE INVENTION (1) Field of the Invention

The present invention relates to a substrate storage container for use in storage, transportation, preservation, processing, etc., of substrates such as, for example silicon wafers, glass, glass masks, etc.

(2) Description of the Prior Art

Recently, in order to further enhance the productivity in the semiconductor industry, large-diametric substrates such as silicon wafers, glass wafers having a diameter of 300 mm have started to be used. Because any of such substrates is liable to sag due to gravity even if it is supported either lengthwise or crosswise, it is strongly demanded that (1) they should be handled securely by being stored in a predetermined substrate storage container so as not to be broken and (2) they should be isolated from particles and organic substances or prevented from being contaminated by metal ions etc., during transportation or during preservation.

A substrate storage container of this type is composed of, though not illustrated, a container body for holding a plurality of substrates in alignment, a door element for opening and closing the front opening of the container body and a sealing gasket interposed between the container body and the door element for creating a seal (see Patent literature 1: Japanese Patent Application Laid-open 2000-306988 (see FIGS. 1 to 10)).

The container body is a molding of a front open box type, formed of a transparent resin or the like, and is used for in-line transportation and preservation. Flanges for transportation are provided as appropriate on the top, bottom and/or side walls of this container body, so that the substrate storage container can be lifted up or transported along the processing line at high speeds overhead with these flanges engaged by robots and transporters. A window for monitoring substrates is partly formed on the rear side etc., of the container body while a plurality of supporting ribs for supporting substrates at their peripheral edge are arrayed vertically (see Patent literature 2: Japanese Patent Application Laid-open Hei 10-70185 (see FIGS. 12, 14 and 17)).

The door element is formed in correspondence with the front of the container body, has a front retainer attached to the inner surface (rear side) facing the container body for holding individual substrates at their front periphery, and is fitted to, and removed from, the container body by a robot. The front retainer is formed of a material being more flexible than that of the supporting ribs, and the contact part with substrates is formed with a multiple number of holding grooves arrayed vertically at regular intervals.

Each holding groove has an approximately U-shaped or approximately V-shaped section, and is formed so that the mid height of the groove is set at a position higher than the position at which the supporting ribs holds the substrate. That is, this configuration provides the function of marginally raising the substrates from the supporting ribs when the door element is closed, whereby contact friction between the substrates and supporting ribs can be reduced and the substrates can be prevented from being contaminated with abraded particles.

In the substrate storage container of this configuration, when the door element is removed from the container body, substrates are inserted along the supporting ribs into the container body or conversely substrates are taken out from the supporting ribs of the container body.

The conventional substrate storage container is configured as described heretofore, and they are transported at high speeds overhead by robot. However, the overhead transport system is difficult to control and high in cost and has a shortcoming that only a small amount of load can be transported at a time. Further, since the installation of overhead transport needs extra space in the height dimension, it is difficult to install it in a factory with a low ceiling.

In view of these circumstances, in recent years, techniques for transporting the substrate storage containers using inexpensive conveyors have been proposed and have started to be put into practical use. The conveyor transport, however, entails a drawback that the substrates and the supporting ribs are rubbed against each other due to vibrations during conveyance, causing substrate contamination, which is a new, considerable problem. Particularly, in conveyor transport, there is more than a small possibility that at the joint between one conveyor and another, the bottom of the substrate storage container might collide with the rail portion of the conveyors and run on the track, whereby the substrates and the supporting ribs are rubbed against each other due to vibrations, contaminating the substrates. Further, if a strong impact acts on the storage container during transport, the substrates will be brought into rigorous contact with the interior, backside of the container body, resulting in damage or breakage.

To solve the above problems, a method has been proposed, in which small projections that come into point or line contact with the undersurface of the substrate are formed on the top surface of the supporting ribs so as to reduce the contact area. However, when the projection comes into point contact with the substrate, the load of the substrate concentrates on the single point, so that there is a fear of the substrate being easily damaged. Further, since these projections are minute in size, there is the problem that imperfect filling and hence shrink marks and deformation are apt to occur during molding, producing variation in the height at which the substrates are supported. Moreover, since it is difficult to finely adjust the height of the projections, there are problems that the substrates cannot be supported horizontally and that failures to unload the substrate are liable to occur due to variation in the pitch distance.

The present invention has been devised in view of the above, it is therefore an object of the present invention to provide a substrate storage container wherein it is possible to prevent the substrates from being contaminated as a result of abrasion between substrates and supporting ribs due to vibrations etc., occurring during conveyor transport and it is possible to prevent the substrates from being damaged or broken by strong contact of the substrates against the container body even when a large impact is applied during conveyor transport, for example.

SUMMARY OF THE INVENTION

In order to achieve the above object, according to the present invention, a substrate storage container for storing substrates in a container body, includes: a conveyor contact rail provided for the container body or a bottom plate attached to the bottom of the container body, and is characterized in that the conveyor contact rail inhibits vibrations acting on substrates when the container body is transported by a conveyor.

In the above configuration, the container body may be configured of a front-open box type that has substrate supporting ribs arranged vertically on both sides therein; a plurality of projections that will come in area contact with the peripheral part of the undersurface of the substrate may be formed on the top surface of each supporting rib so as to extend inwards from the outer side with respect to the width; and both the side edges of each projection may be inclined so that the projection gradually becomes narrower inwards from the outer side with respect to the width of the container body.

Further, the substrate storage container may further include a position restraint member for positioning substrates, disposed in the rear of the supporting ribs, wherein at least the substrate contact area of the position restraint member is formed of a low abrading material different from that of the supporting ribs.

It is also preferable that the conveyor contact rail is arranged, at least, on one of the side portion, front portion and rear portion of the bottom plate, its conveyor contact surface is formed to be an essentially smooth and flat plane, and both ends of the bottom surface of the conveyor contact rail is formed to be inclined upwards toward their respective ends.

Further, both side edges in the end portions of the conveyor rail may be inclined so that each end of the conveyor contact rail gradually becomes wider from the non end to each end of the conveyor contact rail.

Here, though the container body is generally specified in the claims to be a front open boxy type such as FOUP, FOSB and the like, the container may be a top open box type or, may be an open cassette or a carrier type. Also, the container body, either may be or need not be, partially subjected to a transparency process and/or anti-static process. The opening of the container body is opened and closed by a door element if any. This door element may incorporate a latch mechanism which, by an operation from the outside, can cause multiple engaging claws to project from or retract into the peripheral surface of the door element.

Examples of substrates, at least include: a single or multiple number (25 or 26 pieces) of semiconductor wafers (silicon wafers), liquid crystal cells, quartz glass, mask substrates, used in the fields of semiconductor, electricity and electronics. When semiconductor wafers are handled as the precision substrates herein, examples of substrates of course include large-diametric, 300 mm wafers. Also, the conveyor contact surface of the conveyor contact rail may be a smooth and flat plane or an essentially smooth and flat plane.

As described heretofore, according to the present invention, it is possible to efficiently prevent and reduce substrate contamination resulting from rubbing between the substrate and supporting ribs due to vibrations and the like during conveyor transport. If, for example, a large impact acts on the substrate storage container during conveyor transport, it is possible to prevent the substrates from being damaged or broken by strong contact between the container body and substrates.

DESCRIPTION OF THE PREFERRED EMBODIMENTS

Figure 1:
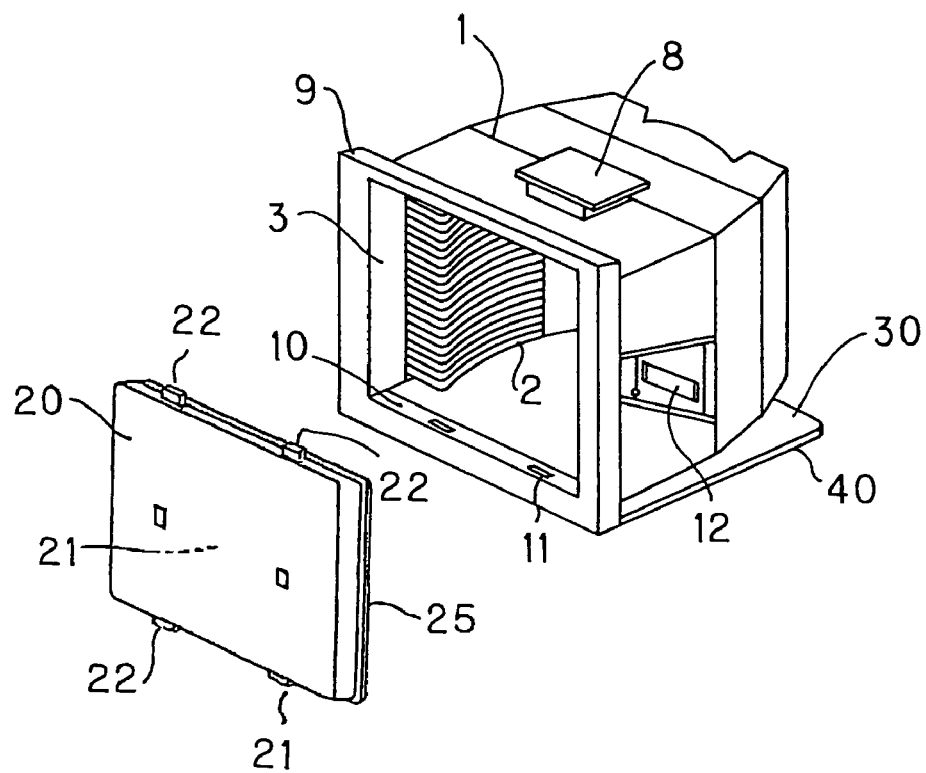
FIG. 1 is an illustrative perspective view showing the embodiment of a substrate storage container according to the present invention.

Referring the drawings, a preferred embodiment of the present invention will be described hereinbelow. As shown in FIGS. 1 to 9, a substrate storage container in the present embodiment, is composed of a container body 1 for holding a plurality of semiconductor wafers supported in alignment by supporting ribs 2, a door element 20 removably fitted with a sealing gasket 25 interposed therebetween so as to open and close the front opening of the container body 1, a bottom plate 30 removably attached to container body 1 and a pair of conveyor contact rails 40 provided for the bottom plate 30. These conveyor contact rails 40 provide the function of reducing vibrations and impacts acting on the semiconductor wafers when the sealed container body 1 is conveyed by an unillustrated conveyor.

As the plural (25, 26 pieces or the like) semiconductor wafers, though not illustrated, 300 mm round-shaped silicon wafers and others can be considered.

Container body 1 is formed of, for example a light impermeable forming material into a front-open box type configuration having an opening on the front side, as shown in FIG. 1, with a high enough strength, rigidity and dimensional stability so as not be deformed. Further, this container functions so as to secure the normal operation of automatic transporters such as AGV etc. As the forming material of this container body 1, a material basically consisting of, for example, a lightweight synthetic resin excellent in formability, such as polycarbonate, cycloolefin polymer, polyetherimide, polyether sulfone or the like, with a content of carbon fibers and/or metal fibers for providing electric conductivity, can be considered.

Figure 4:
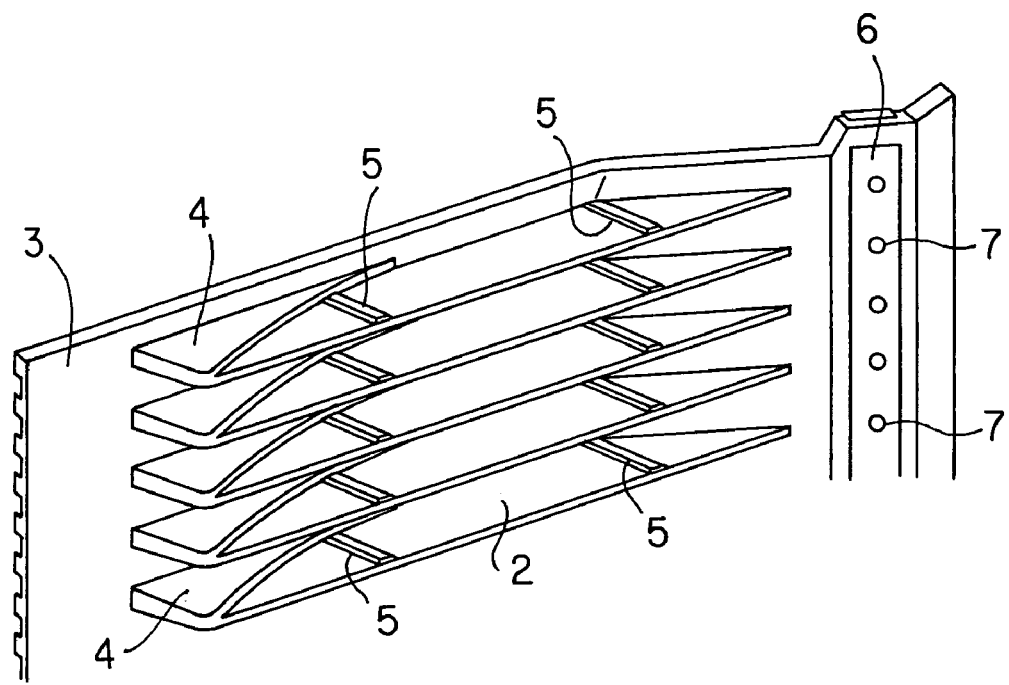
FIG. 4 is an illustrative perspective view showing an interior wall of a container body in the embodiment of a substrate storage container according to the present invention.
Figure 5:
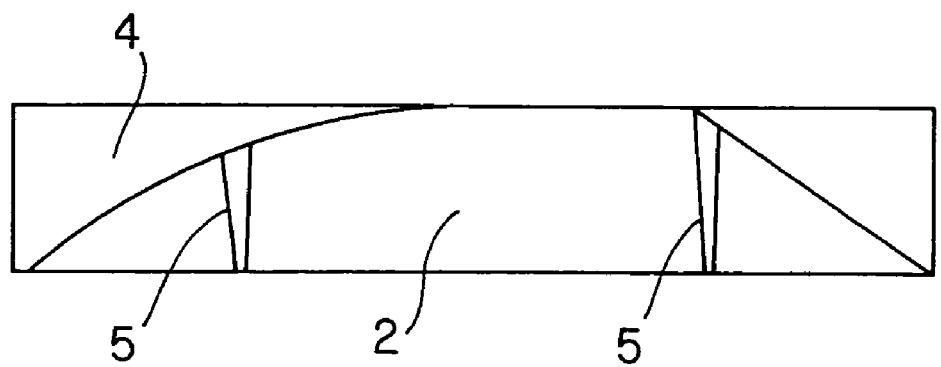
FIG. 5 is an illustrative plan view showing a supporting rib in the embodiment of a substrate storage container according to the present invention.
Figure 6:
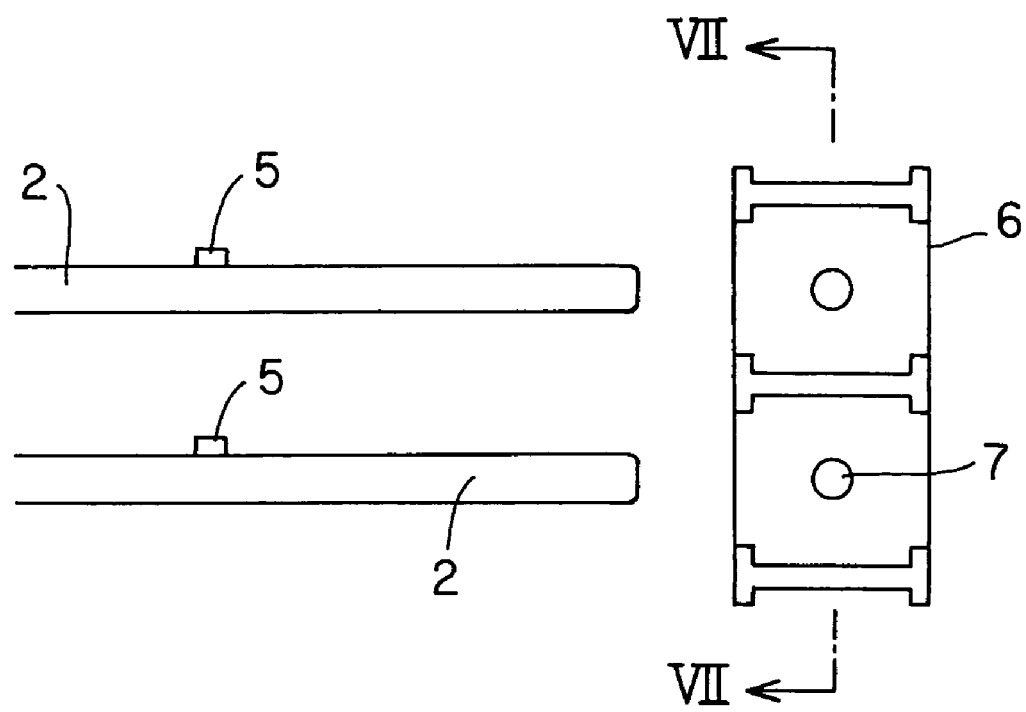
FIG. 6 is an illustrative view showing supporting ribs and a position restraint member in the embodiment of a substrate storage container according to the present invention.
Figure 7:
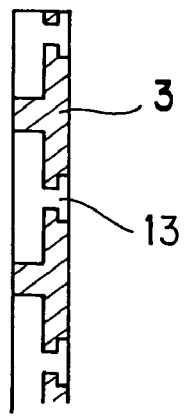
FIG. 7 is a sectional view cut along a line VII-VII in FIG. 6, showing a state before molding of a position restraint member in the embodiment of a substrate storage container according to the present invention.
Figure 8:
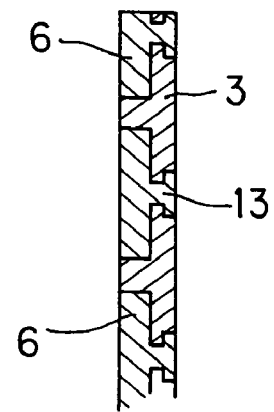
FIG. 8 is a view, corresponding to FIG. 7, showing a position restraint member and a base plate after molding in the embodiment of a substrate storage container according to the present invention.

As shown in FIGS. 1, 4 and 5, a plurality of supporting ribs 2 for supporting semiconductor wafers horizontally are arranged vertically on both sides inside container body 1, with a pitch of a predetermined distance. A pair of position restraint members 6 for semiconductor wafers are provided left and right in the rear of supporting ribs 2, and the paired position restraint members 6 are laid out on both sides in the rear inside container body 1.

Each supporting rib 2 is provided in an shelf-like form that is long in the front-to-rear direction of container body 1 so as to mount and support the semiconductor wafer in a stable and horizontal position, as shown in FIG. 4. These supporting ribs are integrally formed with the interior side of a base plate 3 that is partially flexed. A pair of base plates 3 are insert molded and integrated at both sides inside container body 1 when the container body is molded. Each supporting rib 2 has a slip stopper projection 4, having an approximate triangular shape with its oblique side curved, viewed from top, formed on the top surface thereof, ranging from the front end to the interior. This slip stopper projection 4 abuts the stored semiconductor wafer so as to prevent the wafer from slipping out forwards.

Formed in the front and rear on the top surface of each supporting rib are a plurality of projections 5, which are in contact with only the underside periphery (the part within 5 mm from the peripheral edge) of the semiconductor wafer. Here, a plurality of projections 5 is preferably formed so as to contact with only within 3 mm from the peripheral edge of the semiconductor wafer. These projections extend from the outer side to the inner side with respect to the width of container body 1 and both the side edges of each projection 5 are inclined so that the projection 5 becomes tapered from the outer side to the inner side with respect to the width of container body 1 (see FIGS. 4 and 5). That is, each projection 5 is formed in an elongate trapezoidal form, viewed from top and supports the semiconductor wafer horizontally with its flat surface (top).

Referring in detail to the projection 5, the edge part is set to range from 0.5 to 5 mm in width while the inclined angle with respect to the width direction is adjusted to fall within 0.5 to 5 degrees, so as to provide the advantage of dimensional adjustment of the height and formability. Each projection 5 is adapted to come into surface contact with only the underside periphery at the part within 5 mm from the peripheral edge of the semiconductor wafer. This is because if the contact part exceeds 5 mm, the projection will come into contact with the chip area of the semiconductor wafer without reducing generation of particles, hence lowering the production yield due to particle contamination.

Each position restraint member 6 is molded, essentially in an elongate plate form, of a low abrading material different from that of supporting rib 2 and integrated at the rear of base plate 3, providing the functions of regulating the inserted positions of the semiconductor wafers and holding the periphery of the semiconductor wafers at both sides on the interior side of the container as a front retainer 23 of door element 20 holds the periphery of the semiconductor wafers on the front side of the container, by abutment of inclined facets (see FIG. 4 and FIGS. 6 to 10).

As the material for position restraint members 6, thermoplastic resins excellent in abrasion resistance and smoothness, such as polyethylene terephthalate, polybutylene terephthalate, polyether etherketone etc., and thermoplastic resins containing a sliding agent such as fluoro, silicone compounds, etc., and reinforcing materials such as carbon fiber, glass fiber, metal fiber, etc., can be considered.

In forming position restraint member 6, multiple supporting ribs 2 and base plate 3 are integrally molded (initial molding) of conductive polycarbonate (primary side resin), then the material for position restraint members (secondary side resin) is filled for molding from the rear side of base plate 3 where no supporting rib 2 is provided. The thus integrated position restraint member 6 with base plate 3 is inserted together with base plate 3 and supporting ribs 2 into the mold for container body 1 when the container body is molded, to thereby complete integration with container body 1. Integration of position restraint members 6 makes it possible to reduce residual water during washing and shorten the time for drying. In the insert molding, the resin for the part that is molded first is called the primary side resin and the resin for the part that is molded second is called the secondary side resin.

If it is difficult to fuse position restraint member 6 with base plate 3 (when position restraint member 6 is composed of polybutylene terephthalate, polyether etherketone, fluoro resin, or the like), the forming process is performed as follows.

First, a multiple number of through-holes 7 to form the holds between position restraint member 6 and base plate 3 are formed (see FIG. 6) in the rear part of each base plate 3 on which position restraint member 6 is formed. Then position restraint member 6 consisting of the secondary side resin is molded from the rear side of base plate 3 (see FIG. 7) on which no supporting rib 2 exists. In each opening between the front and rear surfaces, a connecting portion 13 that is narrower than the sizes of the openings at the front and rear sides is formed. Thereafter, molding is formed so that the resin fills both the front and rear sides via multiple through-holes 7. Thus, as position restraint member 6 is integrated with base plate 3 so as to hold base plate 3 from the front and rear surfaces, it is possible to strongly attach position restraint member 6 to base plate 3 (see FIG. 8).

As shown in FIG. 1, an approximately rectangular, viewed from top, robotic flange 8 is removably attached by screw fitting to the top of container body 1. The substrate storage container is transported through the processing line while this robotic flange 8 is being held by an unillustrated automatic transport mechanism called OHT (overhead hoist transfer). A rim portion 9 for door fitting shown in FIG. 1 is integrally formed so as to project sidewards around the periphery of the front opening of container body 1. The inner stepped surface of this rim portion 9 is formed to be a sealing surface 10, and a pair of engaging holes 11 positioned a predetermined distance apart from each other are formed in both the top and bottom portions of this sealing surface 10.

A window for monitoring semiconductor wafers or adjusting the position of semiconductor wafers may be optionally formed on the rear side or on a flank of container body 1. It is preferred that this unillustrated window can be closed in an openable manner by a shutter when it is not needed, that is, during transport or preservation of semiconductor wafers. This shutter may be provided as a slidable curtain that is arranged near the window and covers it. Alternatively, the shutter may be provided as a light shading film that can removably cover the window.

As shown in the same drawing, a side handle 12 for manual transport is removably attached to either of the outer side walls of container body 1. Each side handle 12 is provided in an essentially L-shape, having a grip portion parallel to the bottom of container body 1 and a grip portion perpendicular to the bottom of container body 1.

As shown in FIG. 1, door element 20 is formed of a synthetic resin similar to that of container body 1 and provided as an essentially rectangular hollow structure which incorporates a latch mechanism 21 which, by a rotational operation from the outside, causes a plurality of engaging claws 22 to project from, and retract into, the peripheral surface thereof. With this latch mechanism 21, each engaging claw 22 fits into engaging hole 11 of container body 1, so as to tightly close the front of container body 1 by locking up the door element.

Figure 9:
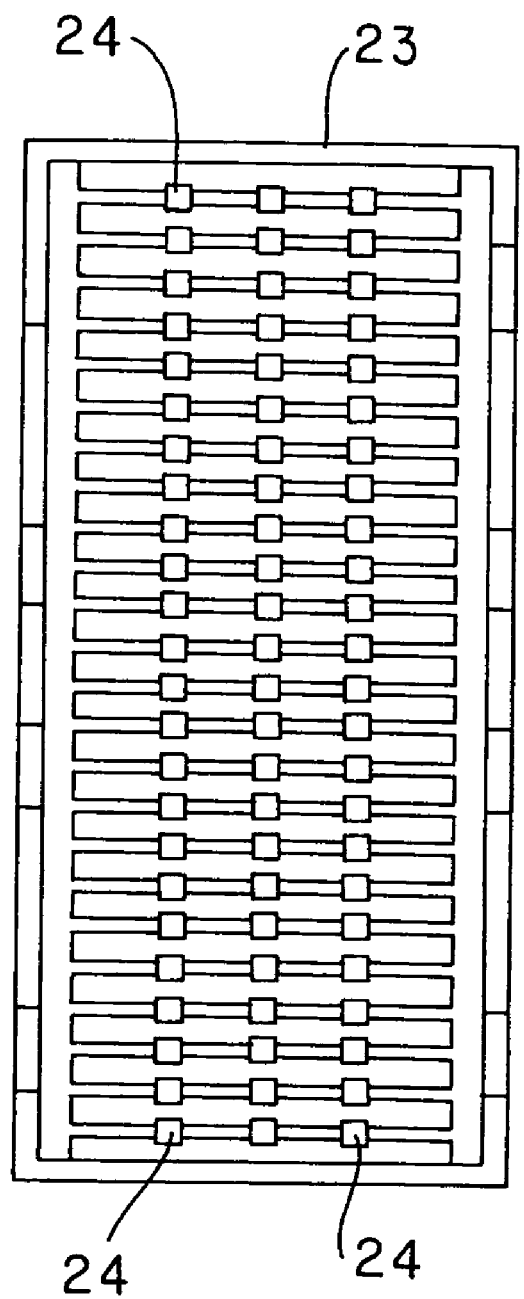
FIG. 9 is an illustrative front view showing a front retainer in the embodiment of a substrate storage container according to the present invention.

As shown in FIG. 9, a front retainer 23 for individually holding semiconductor wafers at their front peripheral edge is removably attached to the inner face of door element 20. An endless sealing gasket 25 is removably attached around the peripheral surface of door element 20, being fitted by means of projections, grooves and/or the like. This sealing gasket 25 is made in press-contact with sealing surface 10 of container body 1, providing a sealing function.

Front retainer 23 is given essentially in a lattice-like configuration and formed of a relatively soft material compared to supporting ribs 2, from a viewpoint of protectively holding the semiconductor wafers in contact. This front retainer is formed in its contact portion with the semiconductor wafers with a plurality of holding grooves 24 arranged vertically in parallel with, and a predetermined distance apart from, each other. Each holding groove 24 has an approximately U-shaped or approximately V-shaped section, and the mid height of the groove is set at a position higher than the position at which the supporting ribs 2 hold the substrate. That is, the semiconductor wafers are marginally raised from the supporting ribs 2 when door element 20 is closed, so that contact friction between the semiconductor wafers and supporting ribs 2 can be reduced and the semiconductor wafers can be prevented from being contaminated with abraded particles.

Sealing gasket 25 is molded in a frame-like form of a thermoplastic elastomer, selected from polyolefin, polyester elastomers and the like, fluororubber, silicone rubber or the like. Preferably, this sealing element is molded of a molding material which contains little organic components that would contaminate semiconductor wafers and has a hardness of 80 degrees or lower, based on the K6301A measurement defined by JIS.

Figure 2:
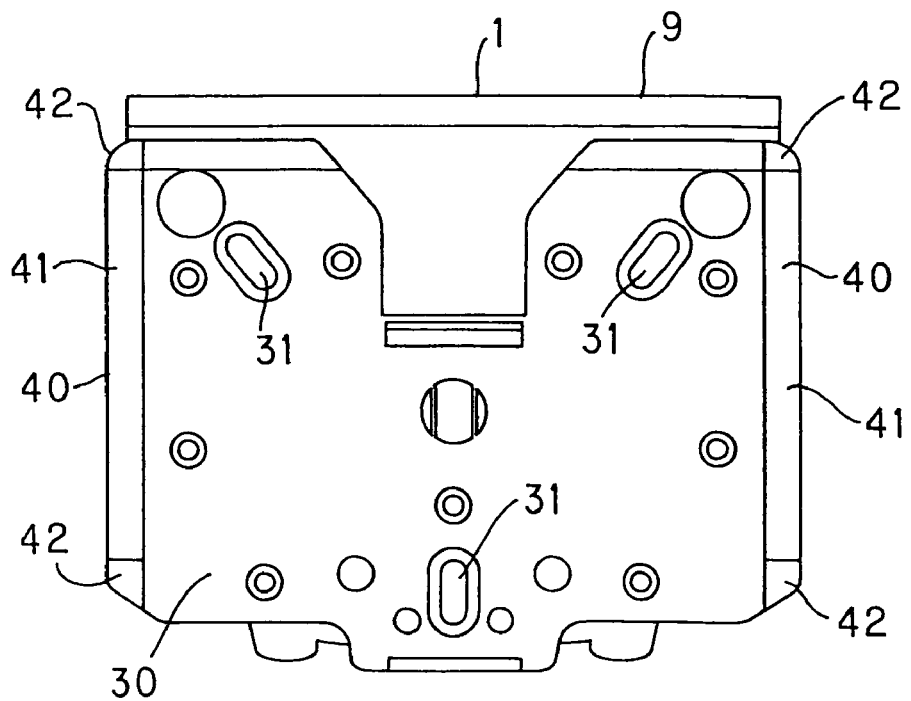
FIG. 2 is a bottom view showing the embodiment of a substrate storage container according to the present invention.

Bottom plate 30 is essentially formed in a laterally long rectangular shape as shown in FIGS. 1 and 2, and has some through-holes to allow for detection and distinction of the type of the substrate storage container, and is removably attached to the underside at the bottom of container body 1. This bottom plate 30 has positioning elements 31 for processing equipment having an approximately v-shaped section, arranged at both sides in the front and at the center in the rear thereof. These positioning elements 31 are arranged at positions forming a triangle and receive pins of the unillustrated processing equipment, so as to position the substrate storage container. As the substrate storage container has been positioned, semiconductor wafers are loaded from the substrate storage container to the processing equipment and unloaded vice versa.

These positioning elements 31 are molded of a material having an excellent abrasion resistance, such as polycarbonate, polybutylene terephthalate, polyether etherketone, polyimide or the like, and provided integrally with or separated from bottom plate 30.

The processing equipment herein indicates a device for loading semiconductor wafers from the substrate storage container and transferring them into another in-process container, a device for automatically removing door element 20 from the substrate storage container or mounting container body 1 with its door element 20 open and loading semiconductor wafers thereinto, and loading semiconductor wafers into, or unloading from, another in-process container for implementing various treatments and processes such as oxidation, photoresist application, exposure, etching, cleaning, membrane forming and others.

Figure 3:
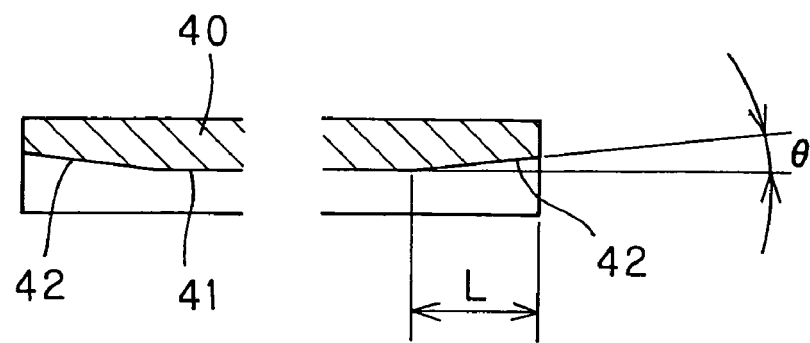
FIG. 3 is an illustrative sectional view showing a conveyor contact rail in the embodiment of a substrate storage container of the present invention.

A pair of conveyor contact rails 40 are formed along the left and right sides of bottom plate 30 as shown in FIGS. 1 to 3.

The bottom surface, i.e., conveyor contact surface 41 is a smooth, flat plane, with the front and rear ends of conveyor contact rail 40, cut away forming bottom surfaces 42 that are inclined upward towards their respective ends. Each conveyor contact rail 40 is formed of a resin excellent in abrasion resistance and slidability, such as polyether etherketone, polyether sulfone, polycarbonate, polybutylene terephthalate, etc., or one of these resins having carbon fiber, fluoro resin, silicone resin or the like added therein.

These conveyor contact rails 40 may be formed separately of the aforementioned material and attached to bottom plate 30 or container body 1, or may be integrally formed as part of bottom plate 30. Conveyor contact rails 40 may be attached as separate parts to the left and right sides of bottom plate 30. Conveyor contact surface 41 may be attached with an abrasion-resistant coating or rollers.

The amount of deformation of conveyor contact surface 41 is preferably limited to 0.3 mm or smaller. This amount of deformation can be determined as the difference between the maximum height and the minimum height from a reference surface of conveyor contact rail 40. The inclined bottom surfaces 42 at both the front and rear of conveyor contact rail 40 are specified to be 5 mm or longer (the length L from the end shown in FIG. 3). The bottom surfaces 42 at both the front and rear of conveyor contact rail 40 are inclined with an angle of inclination $\theta$. This angle of inclination $\theta$ is adjusted to 1 to 10 degrees, or preferably 2 to 7 degrees.

It is also possible to provide a pair of guides arranged perpendicularly to the length of conveyor contact rails 40 in order to prevent the container from falling off the conveyor. Further, in order to make it easy to load the container into the conveyor rails of the conveyor, the side edges of each end part of conveyor contact rail 40 may be formed to be counter tapered with respect to the horizontal, or in other words, the end part of conveyor contact rail 40 may be formed to gradually become wider from the non end to the end, forming a guiding portion. Moreover, the edges of the inclined bottom surface 42 at the end part of the conveyor contact rail may be rounded.

According to the above configuration, it is possible to transport the substrate storage container using low-cost conveyors instead of using overhead transport, hence it is possible to omit the use of a overhead transport system, which is not only expensive but also difficult in control. Further, it is also possible to markedly improve the amount of transport at one time and simply use the substrate storage containers in a factory with a low ceiling.

Further, since conveyor contact surfaces 41 of paired conveyor contact rails 40 are each formed with a smooth flat plane, it is possible to significantly reduce the vibrations during conveyance and there is no fear of contaminating semiconductor wafers due to rubbing between semiconductor wafers and supporting ribs 2 resulting from vibrations during transport. Since each semiconductor wafer is supported by flat surfaces of multiple projections 5, the load of the semiconductor wafer will not concentrate on pointed contacts, so that there is no fear of the semiconductor wafers being damaged.

Since each projection 5 comes into area contact with the semiconductor wafer's undersurface in the portion within 5 mm from the outer peripheral edge, it is possible to minimize the contract area. As a result it is possible to reduce the level of semiconductor wafer contamination with particles to as low as half the ordinary level. This particle contamination of semiconductor wafers can be checked by a semiconductor wafer inspection system (surfscan system) which classifies impurities by use of optical scattering, or by measuring the particles existing in the cleansing liquid when the semiconductor wafers are washed with pure water, using a liquid particle counter, or by other methods. Moreover, since projections 5 are not of a minute configuration, no short shot, shrink and deformation during molding will occur, hence it possible to effectively prevent the occurrence of variation in the height for supporting the semiconductor wafers. Furthermore, since the edge part of each projection 5 is set to range from 0.5 to 5 mm in width and the inclined angle with respect to the width direction is adjusted to fall within 0.5 to 5 degrees, the height of projection 5 can be finely and easily controlled. Accordingly, there is no fear that the semiconductor wafers cannot be supported horizontally and that the semiconductor wafers fail to be taken out successfully due to variation in the pitch distance.

Figure 10:
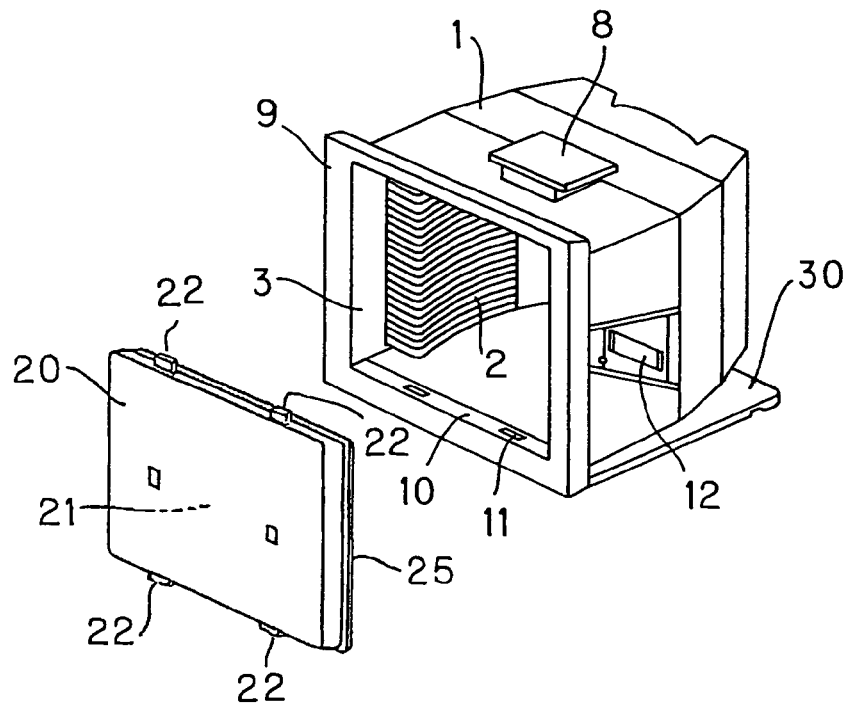
FIG. 10 is an illustrative perspective view showing the second embodiment of a substrate storage container according to the present invention.
Figure 11:
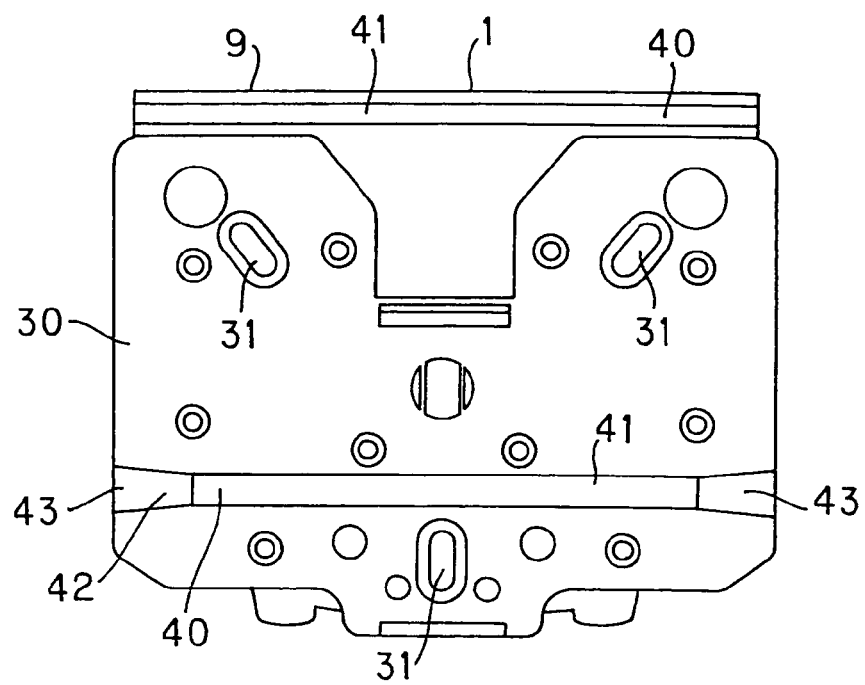
FIG. 11 is a bottom view showing the second embodiment of a substrate storage container according to the present invention.

Next, FIGS. 10 and 11 show the second embodiment of the present invention. In this embodiment, provided is a pair of conveyor contact rails 40, which are directed in the lateral direction perpendicular to the opening and closing direction of door element 20, and disposed at the bottom of the rim portion of container body 1 and at the rear of bottom plate 30. The conveyor contact rail 40 of bottom plate 30 is provided in a groove form so as to provide a guiding function.

The conveyor rail 40 of bottom plate 30 is constructed such that the side edges of each end part are formed to be counter tapered with respect to the horizontal, or in other words, the end part of conveyor contact rail 40 is formed to gradually become wider from the non end to the end, forming an essentially trapezoidal guiding portion 43, in top view. The other components are the same as the above embodiment, so the description is omitted.

Also in this embodiment, the same operation and effect as that of the above embodiment can be expected. In addition, since the depressed, conveyor contact rail 40 of bottom plate 30 provides the guiding function, so that it is obvious that this simple configuration of the substrate storage container is able to effectively prevent itself from falling off the conveyor track.

Figure 12:
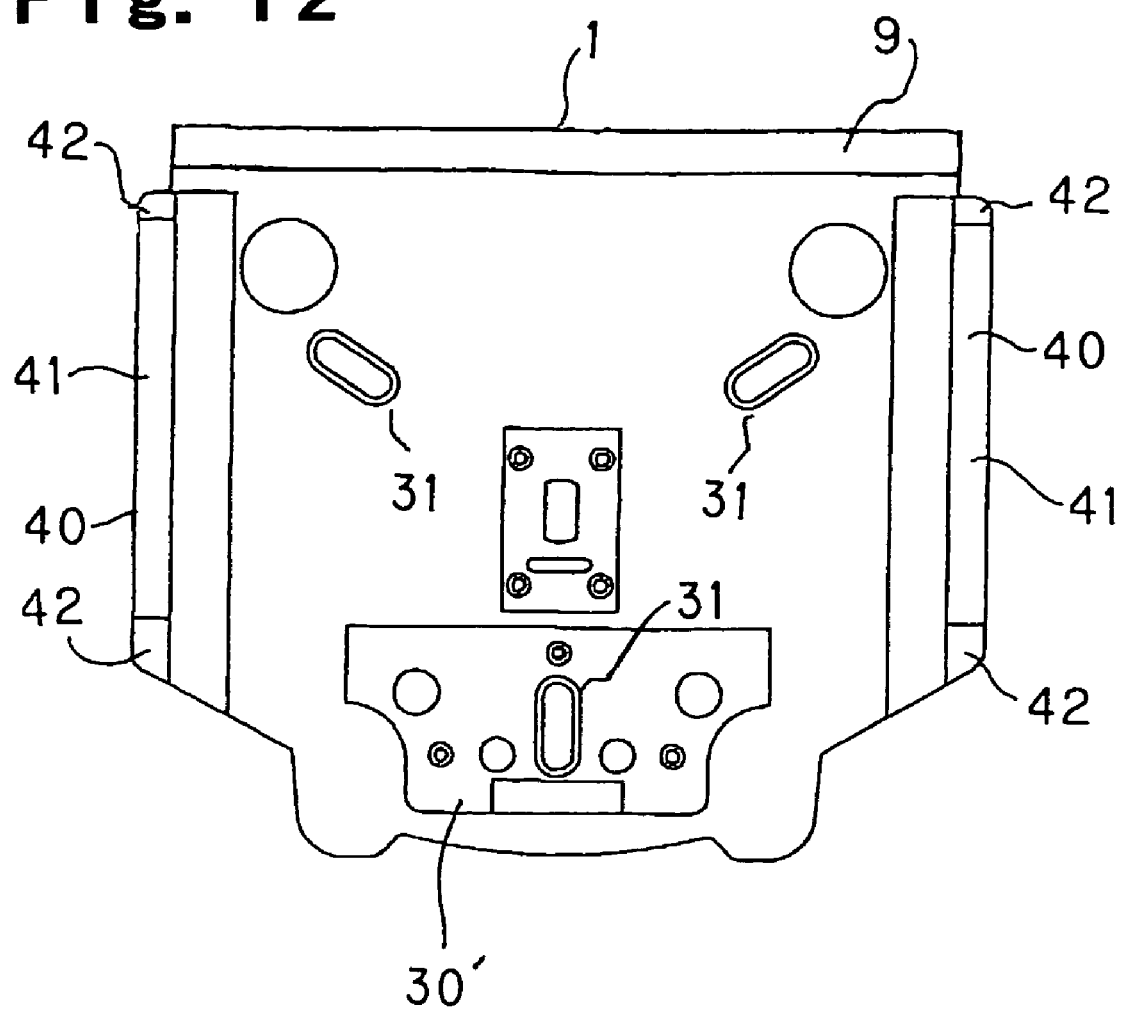
FIG. 12 is a bottom view showing the third embodiment of a substrate storage container according to the present invention.

Next, FIG. 12 shows the third embodiment of the present invention. In this embodiment, provided is a pair of conveyor contact rails 40, which are directed in the direction parallel to the opening and closing direction of door element 20, and integrally disposed with the bottom of container body 1 so as to provide a guide function. Here, in the configuration of FIG. 12, in the rear portion of container body 1, instead of the bottom plate 30 which would cover almost total area of bottom surface of the container body 1 as illustrated in the previous embodiments, disposed is an info pad plate 30' which would cover an area for identifying the container body 1 when mounted on a production equipment. The info pad plate 30' is provided with a plurality of through holes which can be closed with unillustrated dedicated plugs for each hole. The other components are the same as the above embodiment, so the description is omitted.

Also in this embodiment, the same operation and effect as that of the above embodiment can be expected. In addition, since the conveyor contact rail 40 which is integrally disposed with the bottom of container body 1 provides the guiding function, so that it is obvious that this simple configuration of the substrate storage container is able to effectively prevent itself from falling off the conveyor track.

What is claimed is:

1. A substrate storage container for storing substrates in a container body, comprising:
 a pair of conveyor contact rails integrally formed as part of a bottom plate attached to the bottom of the container body,
 a door element removably fitted with a sealing gasket interposed therebetween so as to open and close an opening of the container body, a front retainer for individually holding the substrates at their front peripheral edge being removably attached to the inner face of the door element,
 wherein each of the conveyor contact rails has a conveyor contact surface having a bottom that is formed as a smooth, flat plane and a difference between the maximum height and minimum height from a reference surface of the conveyor contact rail is 0.3 mm or smaller,
 whereby that the conveyor contact rails inhibit vibrations acting on substrates when the container body is transported by a conveyor,
 wherein the container body is configured of a front-open box type that has a base plate with substrate supporting ribs arranged vertically on both sides therein and support the substrate horizontally;
 wherein the base plate includes a pair of position restraint members formed on a rear side and an interior side of the base plate where no supporting rib is provided, the base plate having openings at its front and rear sides, and each position restraint member having a connecting portion that is narrower than the openings at the front and rear sides of the base plate,
 a plurality of projections that will come in area contact within 5 mm from the peripheral part of the undersurface of the substrate are formed on the top surface of each supporting rib so as to extend inwards from the outer side with respect to the width;
 both the side edges of each projection are inclined so that the projection gradually becomes narrower inwards from the outer side with respect to the width of the container body;
 the supporting ribs are formed shelf-like for supporting the substrates and are integrally formed with the base plate with a primary side thermoplastic resin;
 a slip stopper projection is formed in the front end of the supporting ribs while the pair of position restraint members molded with a secondary side thermoplastic resin are provided at the rear portion of the supporting ribs so as to hold the base plate integrally from a front side and an underside, so that the base plate provided with the supporting ribs, the slip stopper projection and the position restraint members is formed integrally with both interior side walls of the container body when the container body is molded with a thermoplastic resin; and
 each position restraint member is molded, essentially in an elongate plate form, of an abrasion resistant material different from that of the supporting ribs and integrated with the base plate, for regulating the inserted positions of the substrates.

2. The substrate storage container according to claim 1, wherein the position restraint member for positioning substrates, is disposed in the rear of the supporting ribs, and wherein at least the substrate contact area of the position restraint member is formed of a low abrading material different from that of the supporting ribs.

3. The substrate storage container according to claim 2, wherein the conveyor contact rails are arranged on the side portions or the front portion and rear portion of the bottom plate and both ends of the bottom surface of the conveyor contact rails are formed to be inclined upwards toward their respective ends.

4. The substrate storage container according to claim 3, wherein both side edges in the end portions of one of the conveyor contact rails are inclined so that each end of the one conveyor contact rail gradually becomes wider from the non end to each end of the one conveyor contact rail.

5. The substrate storage container according to claim 1, wherein the conveyor contact rails are arranged on the side portions or the front portion and rear portion of the bottom plate and both ends of the bottom surface of the conveyor contact rails are formed to be inclined upwards toward their respective ends.

6. The substrate storage container according to claim 5, wherein both side edges in the end portions of the conveyor contact rails are inclined so that each end of the conveyor contact rails gradually becomes wider from the non end to each end of the conveyor contact rails.

7. The substrate storage container according to claim 1, wherein an angle of inclination at both the front and rear ends of the conveyor contact rails is adjusted to 1 to 10 degrees.

8. The substrate storage container according to claim 1, wherein the position restraint member is integrated with the base plate so as to hold the base plate from front and rear surfaces.

9. A substrate storage container for storing substrates in a container body, comprising:
    a container body having an info pad plate in a rear portion, wherein the info pad plate is provided with a plurality of through holes, and
    a pair of conveyor contact rails integrally formed as part of the container body,
    a door element removably fitted with a sealing gasket interposed therebetween so as to open and close an opening of the container body, a front retainer for individually holding the substrates at their front peripheral edge being removably attached to the inner face of the door element,
    wherein each of the conveyor contact rails has a conveyor contact surface having a bottom that is formed as a smooth, flat plane and a difference between the maximum height and minimum height from a reference surface of the conveyor contact rail is 0.3 mm or smaller,
    whereby that the conveyor contact rails inhibit vibrations acting on substrates when the container body is transported by a conveyor, wherein the container body is configured of front-open box type that has a base plate with substrate supporting ribs arranged vertically on both sides therein and support the substrate horizontally;
    wherein the base plate includes a pair of position restraint members formed on a rear side and an interior side of the base plate where no supporting rib is provided,
    a plurality of projections that will come in area contact within 5 mm from the peripheral part of the undersurface of the substrate are formed on the top surface of each supporting rib so as to extend inwards from the outer side with respect to the width; and
    both side edges of each projection are inclined so that the projection gradually becomes narrower inwards from the outer side with respect to the width of the container body;
    wherein the supporting ribs are formed in an elongate shelf-like form with the base plate integrally formed with both interior side walls of the container body while a slip stopper projection is formed in a front end of a front side, and the projections for supporting the substrates are provided with a flat surface formed in an elongate trapezoidal form while the pair of position restraint members are provided at the rear of the supporting ribs so as to hold the base plate integrally from a front side and an underside, so that the base plate provided with the supporting ribs, the slip stopper projection and the position restraint members is formed integrally with both interior side walls of the container body; and
    each position restraint member is molded, essentially in an elongate plate form, of an abrasion resistant material different from that of the supporting ribs and integrated with the base plate, for regulating the inserted positions of the substrates.

10. The substrate storage container according to claim 9, wherein both side edges in the end portions of one of the conveyor contact rails are inclined so that each end of the one conveyor contact rail gradually becomes wider from the non end to each end of the one conveyor contact rail.

11. The substrate storage container according to claim 9, wherein both side edges in the end portions of the conveyor contact rails are inclined so that each end of the conveyor contact rails gradually becomes wider from the non end to each end of the conveyor contact rails.

12. The substrate storage container according to claim 9, wherein an angle of inclination at both the front and rear ends of the conveyor contact rails is adjusted to 1 to 10 degrees.

* * * * *